(12) United States Patent
Hung et al.

(10) Patent No.: US 9,859,402 B2
(45) Date of Patent: Jan. 2, 2018

(54) METHOD OF USING AN ION IMPLANTATION PROCESS TO PREVENT A SHORTING ISSUE OF A SEMICONDUCTOR DEVICE

(71) Applicant: UNITED MICROELECTRONICS CORP., Hsin-Chu (TW)

(72) Inventors: Ching-Wen Hung, Tainan (TW); Rai-Min Huang, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/658,246

(22) Filed: Mar. 16, 2015

(65) Prior Publication Data

US 2016/0276465 A1     Sep. 22, 2016

(51) Int. Cl.
*H01L 21/336* (2006.01)
*H01L 29/66* (2006.01)
*H01L 21/311* (2006.01)
*H01L 21/768* (2006.01)
*H01L 21/3115* (2006.01)

(52) U.S. Cl.
CPC .. *H01L 29/66795* (2013.01); *H01L 21/31116* (2013.01); *H01L 21/76825* (2013.01); *H01L 21/76897* (2013.01); *H01L 29/665* (2013.01); *H01L 21/31155* (2013.01)

(58) Field of Classification Search
CPC ............................. H01L 29/785; H01L 29/665
USPC ........................................................ 438/283
See application file for complete search history.

(56) References Cited

U.S. PATENT DOCUMENTS

| | | | |
|---|---|---|---|
| 4,634,494 A | 1/1987 | Taji | |
| 6,066,550 A | 5/2000 | Wang | |
| 6,342,449 B2 * | 1/2002 | Miyakawa | ............ 257/E21.252 |
| 6,806,197 B2 | 10/2004 | Trapp | |
| 6,989,318 B2 | 1/2006 | Doris | |
| 2009/0263972 A1 | 10/2009 | Balseanu | |
| 2010/0320509 A1 * | 12/2010 | Knorr | ............... H01L 21/76832 257/288 |

OTHER PUBLICATIONS

Vikram Passi, Anisotropic Vapor HF etching of silicon dioxide for Si microstructure release, Jul. 10, 2012.

* cited by examiner

*Primary Examiner* — Hsin-Yi Hsieh
(74) *Attorney, Agent, or Firm* — Winston Hsu

(57) ABSTRACT

The present invention provides a manufacturing method of a semiconductor device, including providing a substrate, where a first dielectric layer is formed on the substrate, at least one gate is formed in the first dielectric layer, at least one hard mask is disposed on the top surface of the gate, and at least two spacers are disposed on two sides of the gate respectively. Next, a blanket implantation process is performed on the hard mask and the first dielectric layer, so as to form an ion rich region in the first dielectric layer, in the hard mask and in the spacer respectively. An etching process is then performed to form a plurality of trenches in the first dielectric layer, and a conductive layer is filled in each trench to form a plurality of contacts in the first dielectric layer.

14 Claims, 4 Drawing Sheets

METHOD OF USING AN ION IMPLANTATION PROCESS TO PREVENT A SHORTING ISSUE OF A SEMICONDUCTOR DEVICE

BACKGROUND OF THE INVENTION

1. Field of the Invention

The present invention relates generally to semiconductor manufacturing process, and more specifically, to a method using an ion implantation process to prevent a shorting issue during the semiconductor manufacturing processes.

2. Description of the Prior Art

Semiconductor processing often involves the deposition of films or layers over or on a semiconductor substrate surface which may or may not have other layers already formed thereon. In typical circuitry fabrication, portions of an outer layer are masked, typically using photoresist, to provide a desired pattern over the outer layer. An underlying layer is then removed by chemical etching through the mask opening, with the mask covering and protecting other areas from the etching. Often it is desirable to etch an outer layer or layers selectively relative to an underlying layer. Accordingly, materials on the substrate, etch chemistry and conditions are continually being developed and improved to achieve a manner by which the desired layer(s) can be etched while stopping and substantially not etching an underlying layer.

Also, some layers are removed by mechanical polishing action or by chemical mechanical polishing action. In many such instances, it is also desirable to remove one or more layers while stopping on some immediately underlying layer.

SUMMARY OF THE INVENTION

The present invention provides a manufacturing method of a semiconductor device, at least comprising: First, a substrate is provided, wherein a first dielectric layer is formed on the substrate, at least one gate is formed in the first dielectric layer, at least one hard mask is disposed on the top surface of the gate, and at least two spacers are disposed on two sides of the gate respectively, next, a blanket implantation process is performed on the hard mask and the first dielectric layer, so as to form an ion rich region in the first dielectric layer, in the hard mask and in the spacer respectively, an etching process is then performed to form a plurality of trenches in the first dielectric layer, and a conductive layer is filled in each trench to form a plurality of contacts in the first dielectric layer.

The feature of the present invention is that after the gate structure and the first dielectric layer are formed on the substrate, the invention further comprises performing the blanket implantation process, so as to dope (implant) ions into these elements. Therefore, the etching rate for etching the implanted nitride layer will be further decreased, and the etching selectivity for etching the silicon oxide to etching the silicon nitride will be further increased too. Since each gate structure can be protected by the spacer and the hard mask well, each gate structure is not easily exposed during the etching process, thereby avoiding the issue of the gate structure being shorted with the source/drain region.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
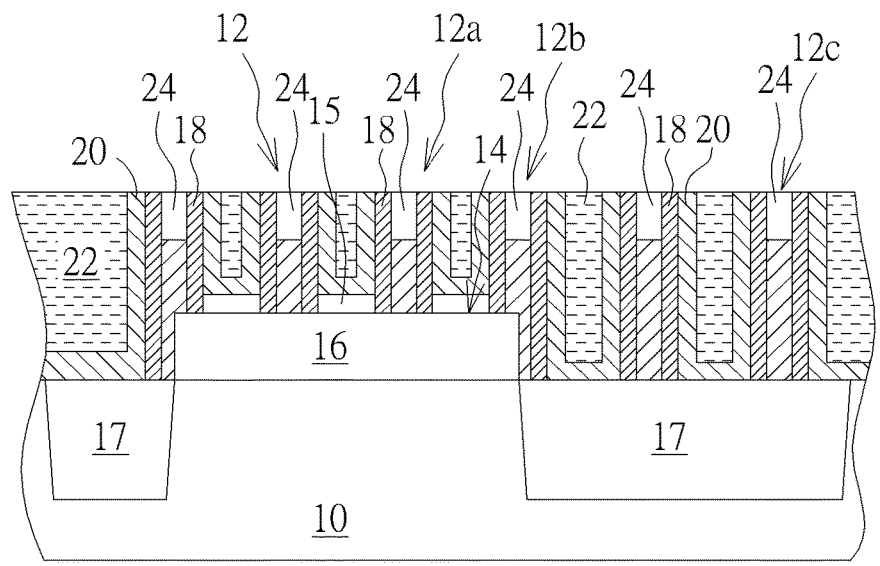
FIGS. 1-7 are schematic diagrams illustrating a manufacturing method of the semiconductor structure according to a first preferred embodiment of the present invention.

Please refer to FIGS. 1-7, which are schematic diagrams illustrating a manufacturing method of the semiconductor structure according to a first preferred embodiment of the present invention. As shown in FIG. 1, a substrate 10 is first provided, wherein the substrate 10 comprises at least one gate structure 12 disposed on the substrate 10 and at least one source/drain region (S/D region) 14 disposed on two sides of the gate structure 12. Besides, the substrate 10 selectively comprises at least one fin structure 16. In this embodiment, the gate structure 12 comprises conductive materials, such as polysilicon or metals. The S/D region 14 can be formed on two sides of the gate structure 12 of the substrate 10 through an ion implantation process, or formed on the fin structure 16 disposed on two sides of the gate structure 12. The method of the present invention further comprises forming at least one shallow trench isolation (STI) 17 in the substrate 10 surrounding the fin structure 16, to isolate the fin structures 16 from other electric elements on the substrate 10. In this embodiment, the gate may cross the fin structure 16 disposed on the substrate 10 (such as the gate structure 12a shown in FIG. 1), or be disposed on the STI 17 (such as the gate structure 12c shown in FIG. 1) and be used as a dummy gate, or may be disposed on the edge of the fin structure 16 to protect the fin structure 16 (such as the gate structure 12b shown in FIG. 1). Also, it should be noted that even though the fabrication process of this embodiment pertains to a non-planar transistor such as FinFET, the fabrication process could also be applied to a planar type transistor.

In addition, the method of the present invention further comprises selectively forming an epitaxial layer 15 on the S/D region 14. Afterwards, a spacer 18 and a contact etching stop layer (CESL) 20 may be formed on two sides of the gate structure 12. A first dielectric layer 22 is then formed on the substrate 10, and a planarization process is then performed, such as a chemical mechanical polishing (CMP), to have the top surface of the gate structure 12 and the top surface of the first dielectric layer 22 on the same level. It is worth noting that in this embodiment, an etching process is performed after the gate structure 12 is completed, to remove parts of the gate structure 12, and a hard mask 24 is then formed to replace the upper portion of the gate structure 12. Another planarization process is then performed to remove the extra hard mask 24. In other words, in the present embodiment, a hard mask 24 is disposed on the top of the gate structure 12, and the top surface of the hard mask 24 and the top surface of the first dielectric layer 22 are on the same level. Besides, since the hard mask 24 replaces some top portion of the gate structure 12, the hard mask 24 is therefore disposed only on the gate structure 12, and disposed between the spacers 18. In addition, since parts of the spacer 18 and parts of the CESL 20 are removed during another planarization process, the spacer 18 and the CESL 20 have a truncated top surface. In the present embodiment, the spacer 18, the CESL 20 and the hard mask 24 mainly comprise silicon nitride, and the first dielectric layer 22 mainly comprises silicon oxide, but not limited thereto. These elements and the manufacturing methods thereof are well known to persons of ordinary skills in the art and the details will not be described here.

Figure 2:
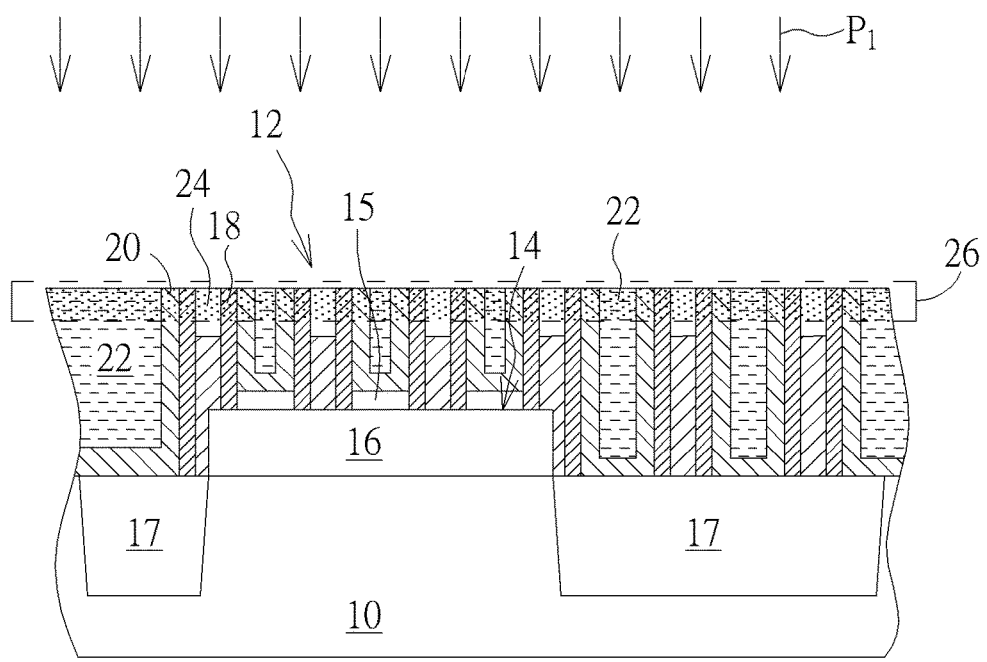

As shown in FIG. 2, a blanket implantation process P1 is performed, so as to dope ions into the hard mask 24 which is disposed on the gate structure 12, the CESL 20 and the first dielectric layer 22. In the present invention, the doped ions may include boron (B), phosphorous (P), gallium (Ga), aluminum (Al), or mixtures thereof and in this embodiment, the selected doped ion is boron, but not limited thereto, and it can be adjusted according to actual requirements. Besides, in the context of this document, "doped" means doping with at least one ion mentioned above, and to a total dopant concentration of one or more of such materials to at least 1% by weight average.

After the blanket implantation process P1 is performed, an implanted region 26 is formed in the top portions of the gate structure 12, the CESL 20 and the first dielectric layer 22. Since the depth of the blanket implantation process P1 can be adjusted, the thickness of the implanted region 26 can also be adjusted as required according to the specific requirement. The thickness of the implanted region 26 is about 500 angstroms in this example.

It is noteworthy that the blanket implantation process P1 is an entirely implanted process, in other words, the ions are doped into all elements disposed on the substrate 10, at least including the gate structure 12, the first dielectric layer 22 and the spacer 18, but the blanket implantation process P1 only decreases the etching rate for etching the nitride layer. More precisely, after the blanket implantation process P1 is performed, the etching rate for etching the nitride layer (such as the spacer 18 and the hard mask 24) will be decreased, according to the applicant's experiments, and the etching rate of the nitride layer will be decreased about 10%-12% after the blanket implantation process P1 is performed while the etching rate for etching the oxide layer (such as the first dielectric layer 22) will not be influenced by the blanket implantation process P1. In other words, the etching rate of the oxide layer is hardly changed after the blanket implantation process P1 is performed.

Figure 3:
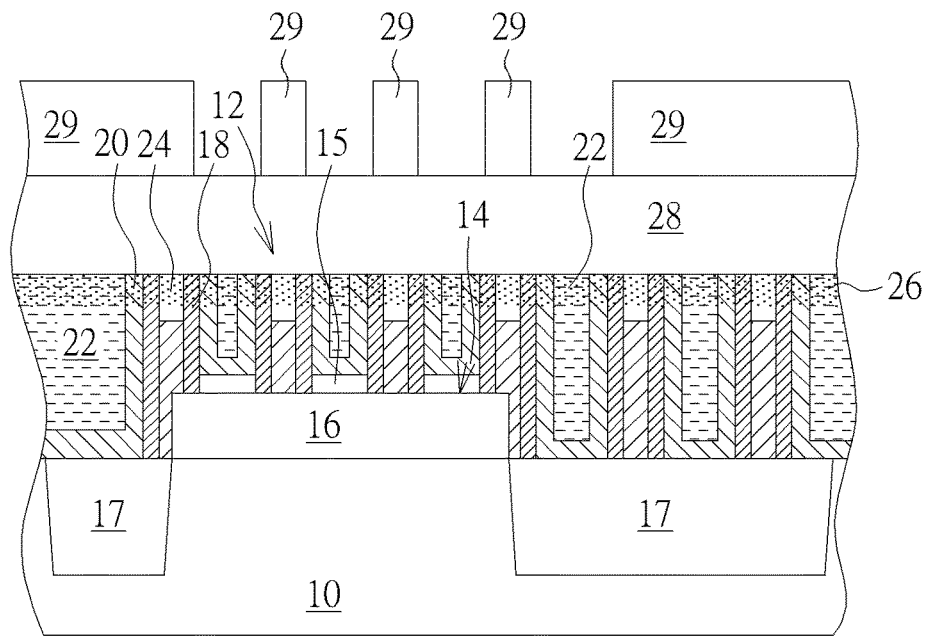

As shown in FIG. 3, a second dielectric layer 28 is then formed on the first dielectric layer 22. The second dielectric layer 28 may be a single layer structure or a multiple-layer structure. Afterwards, a photoresist layer 29 is then formed on the second dielectric layer 28, wherein the photoresist layer 29 may be a single photoresist layer, or in another embodiment of the present invention, the photoresist layer 29 is a multiple-layer structure, such as sequentially including an organic dielectric layer (ODL), a silicon-containing hard mask bottom anti-reflecting coating (SHB) and a photoresist (PR) layer. In short, the photoresist layer 29 can be a tri-layer structure consisting of an ODL/SHB/PR structure, but not limited thereto. Afterwards, in order to form the metal plug that is electrically connected to the S/D region 14, a photo-etching process is performed to pattern the photoresist layer 29 and to form a plurality of openings 30, wherein each opening 30 is at least disposed corresponding to the S/D region 14 disposed below, but not limited thereto. Parts of the openings 30 may be disposed corresponding to the STI 17 surrounding the gate structure 12 to reduce the pattern density difference between the region including the transistor (mainly comprising the gate structure 12, the S/D region 14 and the fin structure 16) and the periphery region.

Furthermore, the photo-etching process mentioned above may comprise a single patterning process (which uses only one photomask and performing the etching process once), or double patterning process (which use two photomasks and performing the etching process twice, or it may be known as the 2P2E process), and it should also be within the scope of the present invention.

Figure 4:
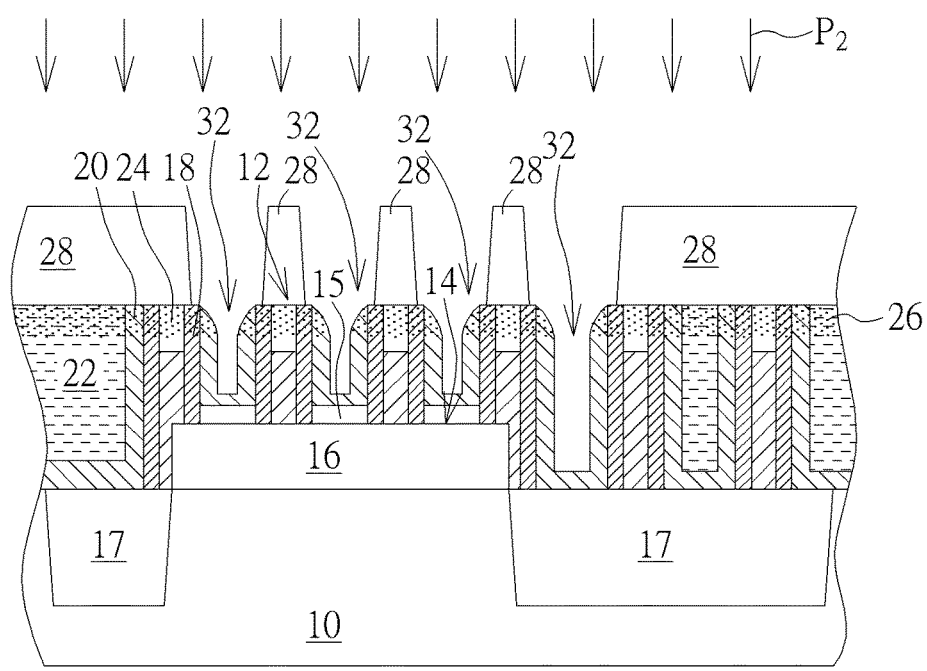
Figure 5:
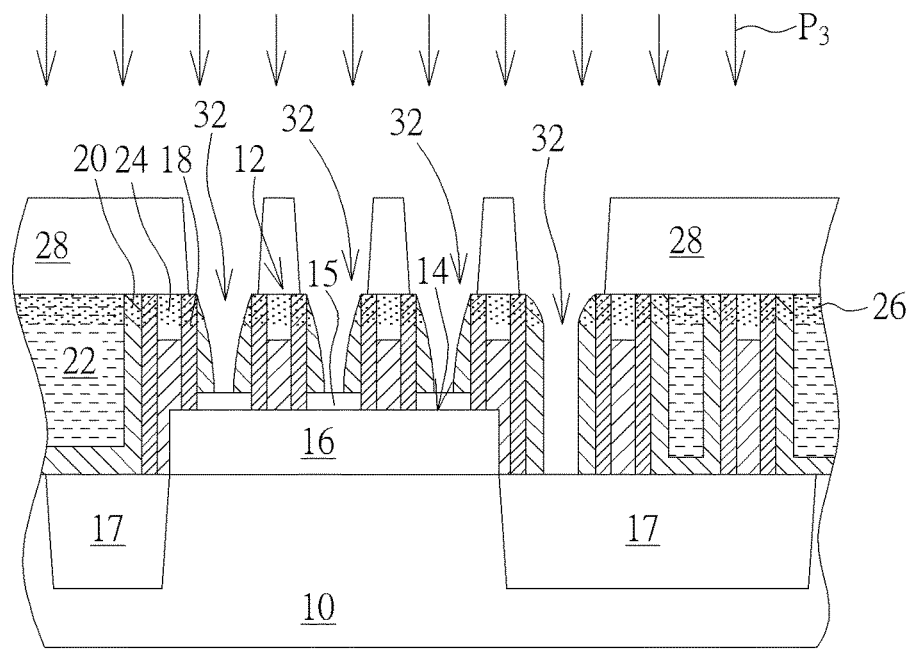

Afterwards, as shown in FIGS. 4-5, at least one etching process P2 is performed to transfer the pattern to other layers disposed below, wherein the etching process P2 comprises: from top to bottom, etching the second dielectric layer 28, the first dielectric layer 22 and the CESL 20 in sequence, until exposing the CESL 20.

The etching process P2 of the present invention uses etching gases, which may comprise per fluorocarbon gases, such as tetrafluoromethane ($CF_4$), fluoroform ($CHF_3$), 1,3-Hexafluorobutadiene ($C_4F_6$), and further comprises oxygen and argon, but not limited thereto. In this embodiment, the main material of the first dielectric layer 22 and the second dielectric layer 28 is silicon oxide, the main material of the hard mask 24, the spacer 18 and the CESL 20 is silicon nitride, and the etching gas in etching process P2 is a high selectivity gas (to silicon nitride and silicon oxide), and the selectivity is preferably larger than 5, so the etching rate for etching the second dielectric layer 28 and etching the first dielectric layer 22 will be relatively fast, but the etching rate for etching the hard mask 24, the spacer 18 and the CESL 20 is relatively slow when the etching process P2 is performed.

It is noteworthy that after the blanket implantation process P1 is performed, the etching rate for etching the implanted nitride layer (such as the spacer 18, the CESL 20 and the hard mask 24) will be further decreased. Therefore, the etching selectivity for etching the silicon oxide to etching the silicon nitride will be further increased too. In this way, while the etching process P2 is performed, the etching rate for etching the upper portion of the CESL 20, the hard mask 24 and the spacer 18 (especially in the implanted region 26) becomes slower, and the gate structure 12 that is disposed under the hard mask 24 and the spacer 18 can be protected well. However, since the etching rate for etching the implanted oxide layer (such as the first dielectric layer 22) is hardly changed, the first dielectric layer 22 can still be removed easily during the etching process P2 until the CESL 20 is exposed.

Afterwards, as shown in FIG. 5, another etching process P3 is then performed, and parts of the CESL 20 are removed to expose the epitaxial layer 15 disposed below and to form a plurality of first trenches 32, wherein each first trench 32 exposes the exitaxial layer 15. It is worth noting that since the epitaxial layer is selectively formed, each first trench 32 may therefore directly expose the S/D region 14. Besides, according to different embodiments, parts of the first trenches 32 may be disposed on STI 17.

Figure 6:
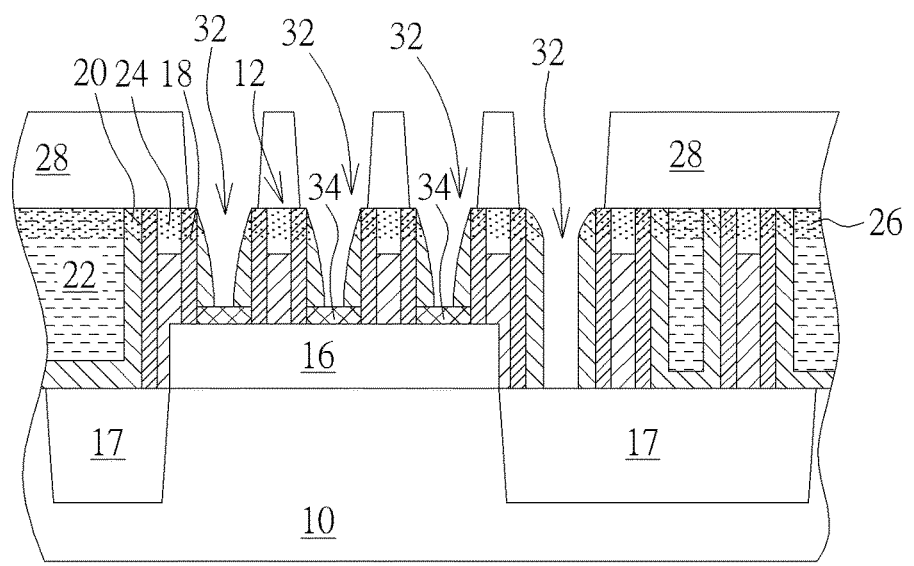

As shown in FIG. 6, a salicide (self-aligned silicide) process is performed on the epitaxial layer 15 to form a salicide layer 34 on the bottom of the first trenches 32. The salicide process mainly comprises filling a metal layer (not shown) in each first trench 32, and a thermal process is then performed to form a salicide layer 34 on the interface between the metal layer and the silicon-containing surface. Afterwards, the metal layer disposed in the first trenches 32 is removed. It is worth noting that since the salicide layer 34 is only formed on the silicon-containing surface, it may therefore be formed on the fin structure 16, on the epitaxial layer 15 or on the substrate 10, but will not be formed on the STI 17.

Figure 7:
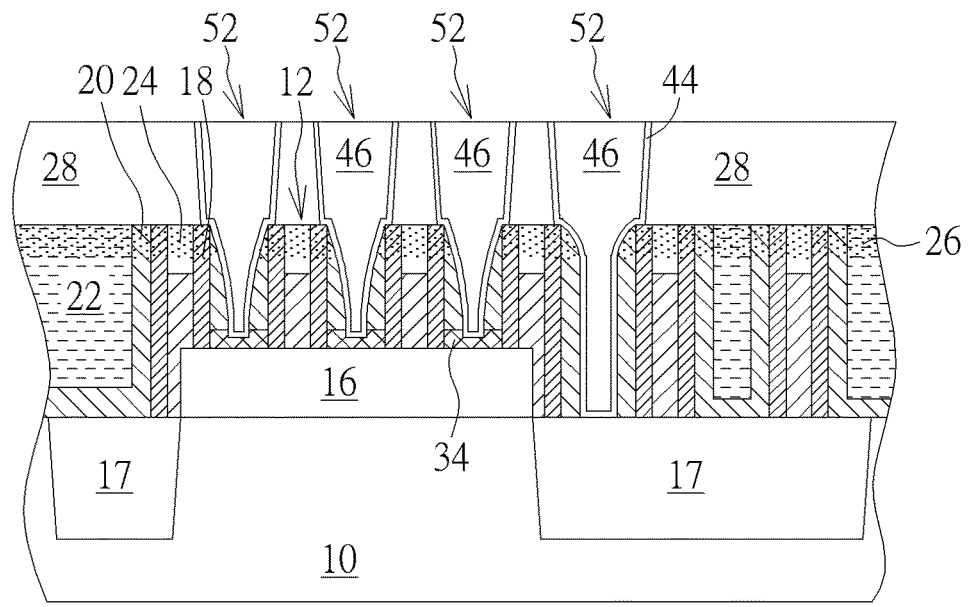

As shown in FIG. 7, a barrier layer 44 and a metal layer 46 are filled in each first trench 32 simultaneously, wherein the barrier layer 44 may comprise titanium nitride (TiN), tantalum nitride (TaN) or Ti/TiN multiple barrier layers to improve the adhesivity between the inner surface of each trench and the metal layer formed in the following steps. The metal layer 46 preferably comprises tungsten (W), which has better gap fill performance. A planarization process is then performed to remove the extra barrier layer and the metal layer disposed on the top surface of the second dielectric layer 28 to forma plurality of first contacts 52 in the first dielectric layer 22 and in the second dielectric layer 28, wherein each first contact 52 at least is electrically connected to parts of the S/D region 14.

Figure 7A:
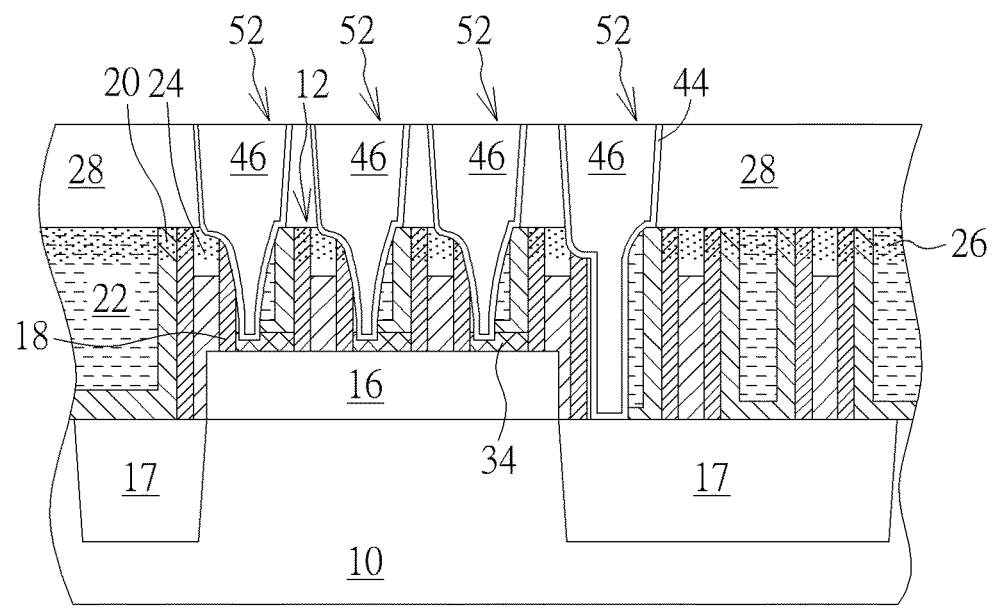
FIG. 7A shows the semiconductor structure of the present invention when a mis-alignment issue occurs.

The feature of the present invention is that after the gate structure 12 and the first dielectric layer 22 are formed on the substrate 10, the invention further comprises performing the blanket implantation process P1, so as to dope (implant) ions into these elements, especially doping the ions such as boron into the upper portion of the hard mask 24, the spacer 18 and the first dielectric layer 22. Therefore, the etching rate for etching the implanted nitride layer will be further decreased, and the etching selectivity for etching the silicon oxide to etching the silicon nitride will be further increased too. Since each gate structure 12 can be protected by the spacer 18 and the hard mask 24 well, each gate structure 12 is not easily exposed during the etching process P2, thereby avoiding the issue that the gate structure is shorted with source/drain region. Please refer to FIG. 7A, which shows a situation when a mis-alignment issue occurs. As shown in FIG. 7A, even though a mis-alignment issue occurs, each gate structure 12 still not easily exposed during the etching process P2, and the shorting issue can be prevented.

It is noteworthy that since the blanket implantation process P1 is performed after the first dielectric layer 22 is formed on the substrate 10, the implanted ions will not be doped into the substrate 10 directly, and the implanted region will only stop on the upper region (such as the implanted region 26 shown in FIG. 2) of the hard mask 24, the spacer 18 and the first dielectric layer 22. In this way, the influencing of the finFET's performance can be prevented due to the implanted ions not being implanted into the substrate directly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor device, at least comprising the following steps:
providing a substrate, wherein a first dielectric layer is formed on the substrate, at least one gate is formed in the first dielectric layer, at least one hard mask is disposed on a top surface of the gate, and at least two spacers are disposed on two sides of the gate respectively, wherein a top surface of the first dielectric layer, a top surface of the hard mask and a top surface of each of the at least two spacers are on a same level;
performing a blanket implantation process on the hard mask and the first dielectric layer, so as to form an ion rich region in the first dielectric layer, in the hard mask and in the spacers respectively, wherein the highest point of the top surface of the hard mask, the highest point of the top surface of the first dielectric layer, and the highest point of the top surface of each of the spacers are at the same level, and are exposed while the blanket implantation process is performed;
performing an etching process to form a plurality of trenches in the first dielectric layer; and
filling a conductive layer in each of the trenches to form a plurality of contacts in the first dielectric layer.

2. The method of claim 1, further comprising forming at least two source/drain regions disposed on two sides of the gate respectively.

3. The method of claim 2, wherein at least one of the plurality of the trenches exposes one of the at least two source/drain regions.

4. The method of claim 1, further comprising performing a salicide process to form a salicide layer in each of the trenches.

5. The method of claim 1, wherein the ion rich region is only disposed on a top portion of each of the spacers.

6. The method of claim 1, wherein the blanket implantation process includes a process implanting boron, aluminum, phosphorous, gallium, or mixtures thereof.

7. The method of claim 1, further comprising performing a planarization process on the hard mask and to the first dielectric layer, and after the planarization process is performed, the top surface of the hard mask and the top surface of the first dielectric layer are on the same level.

8. The method of claim 1, wherein the blanket implantation process is performed after planarization process is performed.

9. The method of claim 1, further comprising forming at least one fin structure on the substrate.

10. The method of claim 1, further comprising forming an etching stop layer disposed on two sides of the gate, and the etching stop layer has a truncated top surface.

11. The method of claim 10, wherein parts of the ion rich region are disposed in the etching stop layer.

12. The method of claim 1, further comprising forming a barrier layer in each of the trenches.

13. The method of claim 1, wherein after the blanket implantation process is performed, an etching rate for etching the ion rich region within the spacers is decreased.

14. The method of claim 1, further comprising forming a second dielectric layer on the first dielectric layer, and the contacts are also disposed in the second dielectric layer.

* * * * *